US012690218B2

(12) United States Patent
Cheng et al.

(10) Patent No.: US 12,690,218 B2
(45) Date of Patent: Jul. 21, 2026

(54) SEMICONDUCTOR STRUCTURES AND MANUFACTURING METHODS THEREOF

(71) Applicant: ENKRIS SEMICONDUCTOR, INC., Suzhou (CN)

(72) Inventors: Kai Cheng, Suzhou (CN); Peng Xiang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 912 days.

(21) Appl. No.: 17/915,387

(22) PCT Filed: Aug. 13, 2020

(86) PCT No.: PCT/CN2020/108916
§ 371 (c)(1),
(2) Date: Sep. 28, 2022

(87) PCT Pub. No.: WO2022/032576
PCT Pub. Date: Feb. 17, 2022

(65) Prior Publication Data
US 2023/0134265 A1     May 4, 2023

(51) Int. Cl.
*H10D 30/47* (2025.01)
*H10D 30/01* (2025.01)
(Continued)

(52) U.S. Cl.
CPC ......... *H10D 30/472* (2025.01); *H10D 30/015* (2025.01); *H10D 30/4732* (2025.01); *H10D 62/824* (2025.01); *H10D 62/8503* (2025.01)

(58) Field of Classification Search
CPC ............... H10D 30/472; H10D 30/015; H10D 62/8503; H10D 62/824; H10D 62/00; H10D 30/471
See application file for complete search history.

(56) References Cited

U.S. PATENT DOCUMENTS 8,987,091 B2     3/2015  Then et al.
9,209,290 B2    12/2015  Then et al.
(Continued)

FOREIGN PATENT DOCUMENTS

CN     104011867 A     8/2014
CN     106298887 A     1/2017
(Continued)

OTHER PUBLICATIONS

State Intellectual Property Office of the People's Republic of China, Office Action and Search Report Issued in Application No. 2020801024191, Apr. 19, 2025, 15 pages. (Submitted with Machine Translation).
(Continued)

*Primary Examiner* — William B Partridge
*Assistant Examiner* — Alexandre X Ramirez
(74) *Attorney, Agent, or Firm* — BSJ & SUN LLC

(57) ABSTRACT

The present disclosure provides a semiconductor structure and a manufacturing method thereof. The semiconductor structure includes: a semiconductor substrate, a back barrier layer, a channel layer and an etch stop layer arranged from bottom to up; and a P-type semiconductor layer located on a source region and a drain region of the etch stop layer.

16 Claims, 5 Drawing Sheets

(51) Int. Cl.
    *H10D 62/824*      (2025.01)
    *H10D 62/85*      (2025.01)

(56)          References Cited

U.S. PATENT DOCUMENTS

| 9,530,878 | B2 | 12/2016 | Then et al. | |
|---|---|---|---|---|
| 9,559,012 | B1 | 1/2017 | Chu et al. | |
| 9,755,062 | B2 | 9/2017 | Then et al. | |
| 2007/0018199 | A1* | 1/2007 | Sheppard | H10D 30/015 |
| | | | | 257/E29.127 |
| 2011/0227093 | A1* | 9/2011 | Hikita | H10D 30/475 |
| | | | | 257/E29.089 |
| 2012/0280244 | A1 | 11/2012 | Hwang et al. | |
| 2013/0292698 | A1 | 11/2013 | Then et al. | |
| 2015/0171205 | A1 | 6/2015 | Then et al. | |
| 2015/0221727 | A1* | 8/2015 | Kub | H10D 84/0119 |
| | | | | 257/77 |

| 2016/0064540 | A1 | 3/2016 | Then et al. |
|---|---|---|---|
| 2017/0104094 | A1 | 4/2017 | Then et al. |

FOREIGN PATENT DOCUMENTS

| CN | 106486363 A | 3/2017 |
|---|---|---|
| CN | 107346785 A | 11/2017 |
| CN | 107851612 A | 3/2018 |
| IN | 102290439 A | 12/2011 |

OTHER PUBLICATIONS

ISA State Intellectual Property Office of the People's Republic of China, International Search Report Issued in Application No. PCT/CN2020/108916, May 6, 2021, WIPO, 5 pages.
ISA State Intellectual Property Office of the People's Republic of China, Written Opinion of the International Searching Authority Issued in Application No. PCT/CN2020/108916, May 6, 2021, WIPO, 4 pages.(Submitted with Machine/Partial Translation).

* cited by examiner

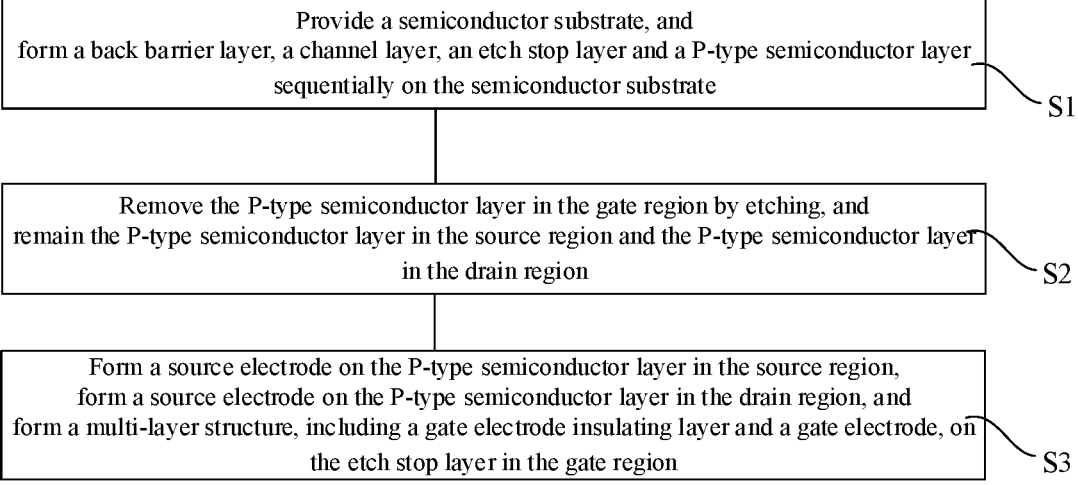

| Provide a semiconductor substrate, and form a back barrier layer, a channel layer, an etch stop layer and a P-type semiconductor layer sequentially on the semiconductor substrate | S1 |

| Remove the P-type semiconductor layer in the gate region by etching, and remain the P-type semiconductor layer in the source region and the P-type semiconductor layer in the drain region | S2 |

| Form a source electrode on the P-type semiconductor layer in the source region, form a source electrode on the P-type semiconductor layer in the drain region, and form a multi-layer structure, including a gate electrode insulating layer and a gate electrode, on the etch stop layer in the gate region | S3 |

FIG. 1

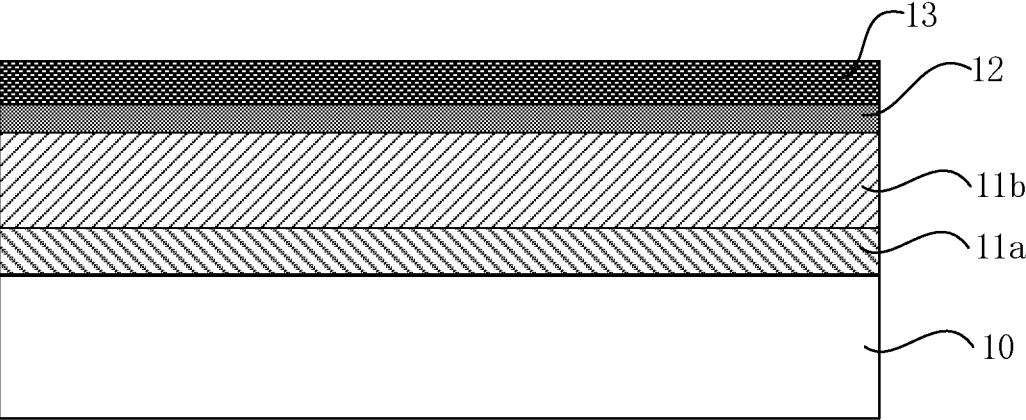

FIG. 2

SEMICONDUCTOR STRUCTURES AND MANUFACTURING METHODS THEREOF

CROSS REFERENCE TO RELATED APPLICATION

This application is a US National Phase of a PCT Application No. PCT/CN2020/108916, filed on Aug. 13, 2020, the contents of which are incorporated herein by reference in its entirety.

TECHNICAL FIELD

The present disclosure relates to the field of semiconductor technology, and in particular, to semiconductor structures and manufacturing methods thereof.

BACKGROUND

Wide-bandgap semiconductor materials, for example, group III nitrides, as typical third-generation semiconductor materials, have excellent characteristics of large bandgap, high pressure resistance, high temperature resistance, high electron saturation velocity and drift velocity, and easy formation of high-quality heterostructures, and thus are suitable for manufacturing high temperature, high frequency, high power electronic devices.

Carrier mobility of the channel in the MOSFET device manufactured by existing manufacturing process is relatively low.

In view of this, it is necessary to provide a new semiconductor structure and a manufacturing method thereof, so as to solve the above technical problems.

SUMMARY

The object of the present disclosure is to provide a semiconductor structure and a manufacturing method thereof.

In order to achieve the above object, a first aspect of the present disclosure provides a semiconductor structure, including:

a semiconductor substrate, a back barrier layer, a channel layer and an etch stop layer which are arranged from bottom to up; and a P-type semiconductor layer located in a source region and a drain region on the etch stop layer.

In some embodiments, a material of the P-type semiconductor layer includes a group III nitride material.

In some embodiments, the material of the P-type semiconductor layer includes GaN.

In some embodiments, a material of the etch stop layer includes at least one of AlN, AlGaN, an alternating multilayer superlattice structure with GaN/AlGaN, or an alternating multilayer superlattice structure with AlGaN/AlN.

In some embodiments, the material of the etch stop layer includes at least one of p-AlN, p-AlGaN, an alternating multilayer superlattice structure with p-GaN/p-AlGaN, or an alternating multilayer superlattice structure with p-AlGaN/p-AlN.

In some embodiments, the channel layer includes a group III nitride material.

In some embodiments, an anti-alloy scattering layer is provided between the back barrier layer and the channel layer.

In some embodiments, a source electrode is provided on the P-type semiconductor layer in the source region, a drain electrode is provided on the P-type semiconductor layer in the drain region, and a multi-layer structure, including a gate electrode insulating layer and a gate electrode, is provided on the etch stop layer in the gate region.

Another aspect of the present disclosure provides a method of manufacturing a semiconductor structure, including:

providing a semiconductor substrate, on which a back barrier layer, a channel layer, an etch stop layer and a P-type semiconductor layer are sequentially formed;

Etching the P-type semiconductor layer to remove a P-type semiconductor layer in a gate region of the semiconductor structure, retaining the P-type semiconductor layer in a source region and a drain region of the semiconductor structure.

In some embodiments, a material of the P-type semiconductor layer includes a group III nitride material.

In some embodiments, the material of the P-type semiconductor layer includes GaN.

In some embodiments, a material of the etch stop layer includes at least one of AlN, AlGaN, an alternating multilayer superlattice structure with GaN/AlGaN, or an alternating multilayer superlattice structure with AlGaN/AlN.

In some embodiments, the material of the etch stop layer includes at least one of p-AlN, p-AlGaN, an alternating multilayer superlattice structure with p-GaN/p-AlGaN, or an alternating multilayer superlattice structure with p-AlGaN/p-AlN.

In some embodiments, the channel layer includes a group III nitride material.

In some embodiments, an anti-alloy scattering layer is provided between the back barrier layer and the channel layer.

In some embodiments, the method of manufacturing the semiconductor structure further includes: forming a source electrode on the P-type semiconductor layer in the source region, forming a drain electrode on the P-type semiconductor layer in the drain region, and forming a multi-layer structure, which includes a gate electrode insulating layer and a gate electrode, on the etch stop layer in a gate region.

BRIEF DESCRIPTION OF THE DRAWINGS

FIG. 1 is a flowchart of a method of manufacturing a semiconductor structure according to a first embodiment of the present disclosure;

FIG. 2 is a schematic view illustrating an intermediate structure corresponding to processes of FIG. 1;

Figure 3:
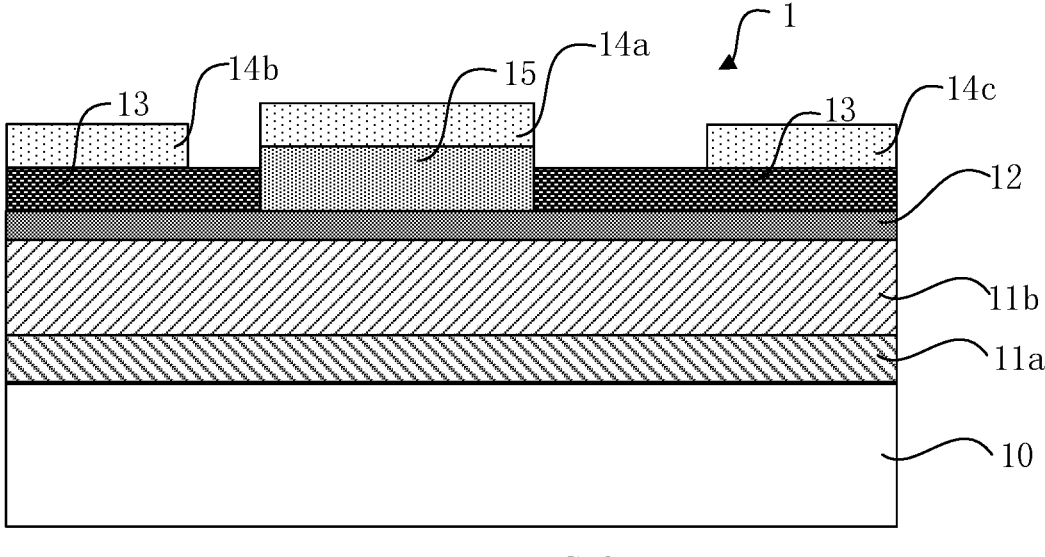
FIG. 3 is a cross-sectional structural diagram of a semiconductor structure according to a first embodiment of the present disclosure.

To facilitate the understanding of the present disclosure, all reference numerals appearing in the present disclosure are listed below:

| | |
|---|---|
| Semiconductor | Semiconductor substrate 10 |
| Structures 1, 2, 3, 4, 5, 6, 7, 8 | |
| Back barrier layer 11a | Channel layer 11b |
| Etch stop layer 12 | P-type semiconductor layer 13 |
| Gate electrode 14a | source electrode 14b |
| Drain electrode 14c | Gate electrode insulating layer 15 |
| P-type ion heavily doped layer 16 | Nucleation layer 17a |
| Buffer layer 17b | Anti-alloy scattering layer 18 |

DETAILED DESCRIPTION OF THE EMBODIMENTS

To make the above objects, features and advantages of the present disclosure more apparent and understandable, embodiments of the present disclosure will be described in detail below with reference to accompanying drawings.

Related manufacturing processes result in low carrier mobility in the channel in the MOSFET device. According to the analysis of the inventors, the reason for causing the above problem is that: in a process of forming the gate electrode insulating layer and the gate electrode, the P-type semiconductor layer on a surface of the channel layer needs to be removed, however, an etching depth cannot be accurately controlled, that is, the etching depth cannot be accurately controlled to an interface between the P-type semiconductor layer and the channel layer, which can damage the surface of the channel layer and reduce the carrier mobility in the channel. Based on the above analysis, the present disclosure forms an etch stop layer between the channel layer and the P-type semiconductor layer.

Compared with the related art, the present disclosure has following beneficial effects.

1) Due to the setting of the etch stop layer, when the P-type semiconductor layer in the gate region is removed by etching, the etching can be stopped at the etch stop layer, the etching depth can be accurately controlled without causing etching damage to the channel layer. Therefore, the carrier mobility of holes in the channel in the semiconductor structure can be improved, and yield and performance of the device can be improved.

2) In an alternative solution, the material of the etch stop layer includes at least one of p-AlGaN, an alternating multilayer superlattice structure with p-GaN/p-AlGaN, or an alternating multilayer superlattice structure with p-AlGaN/p-AlN. In other words, the etch stop layer includes a P-type doped material, which can not only prevent etching damage to the channel layer, but also compensate holes for the channel layer and improve the performance of the positive channel Metal Oxide Semiconductor (PMOS) device.

3) In an alternative solution, there is an anti-alloy scattering layer between the back barrier layer and the channel layer. The anti-alloy scattering layer can improve carrier mobility of holes in the channel.

FIG. 1 is a flowchart of a method of manufacturing a semiconductor substrate according to a first embodiment of the present disclosure; and FIG. 2 is a schematic view illustrating an intermediate structure corresponding to the process of FIG. 1. FIG. 3 is a cross-sectional structural diagram of a semiconductor structure according to a first embodiment of the present disclosure.

First, referring to step S1 in FIG. 1 and as shown in FIG. 2, a semiconductor substrate 10 is provided, and a back barrier layer 11a, a channel layer 11b, an etch stop layer 12 and a P-type semiconductor layer 13 are sequentially formed on the semiconductor substrate 10.

A material of the semiconductor substrate 10 can include sapphire, silicon carbide, silicon, GaN or diamond.

The back barrier layer 11a and the channel layer 11b form a heterojunction, and two-dimensional hole gas can be formed at an interface between the back barrier layer 11a and the channel layer 11b.

Materials of the back barrier layer 11a and/or the channel layer 11b can include a group III nitride material. The group III nitride material can include at least one of GaN, AlGaN, InGaN, or AlInGaN. Forming processes for the back barrier layer 11a and/or the channel layer 11b can include: Atomic Layer Deposition (ALD), Chemical Vapor Deposition (CVD), Molecular Beam Epitaxial growth method (MBE), Plasma Enhanced Chemical Vapor Deposition (PECVD), Low Pressure Chemical Vapor Deposition (LPCVD), Metal-Organic Chemical Vapor Deposition (MOCVD), or a combination thereof.

In an alternative solution, the channel layer 11b can be an unintentionally doped GaN layer.

In this embodiment, it is noted that a chemical element represents a certain material, but molar ratios of respective chemical elements in a material are not limited. For example, a GaN material include a gallium (Ga) element and a nitrogen (N) element, but a molar ratio of the gallium element to the nitrogen element is not limited; an AlGaN material includes aluminum, gallium and nitrogen elements, but respective molar ratios of the three elements are not limited.

Under a same etching condition, a material of the etch stop layer 12 can be a material having a difference from the P-type semiconductor layer 13 in an etch rate, for example, the material of the etch stop layer 12 can be an aluminum-containing material, and can include at least one of AlN or AlGaN. The material of the etch stop layer 12 can also be at least one of an alternating multilayer superlattice structure with GaN/AlGaN or an alternating multilayer superlattice structure with AlGaN/AlN.

A thickness of the etch stop layer 12 ranges from 0.1 nm to 10 nm.

In some embodiments, the etch stop layer 12 can be a P-type doped material, such as at least one of: p-AlN, p-AlGaN, an alternating multilayer superlattice structure with p-GaN/p-AlGaN, or an alternating multilayer superlattice structure with p-AlGaN/p-AlN, to compensate holes for the channel layer 11b.

The material of the P-type semiconductor layer 13 can be a group III nitride material, such as at least one of GaN, AlGaN, or AlInGaN, and the P-type doping ions can include at least one of: magnesium (Mg) ions, zinc (Zn) ions, calcium (Ca) ions, strontium (Sr) ions or barium (Ba) ions, which can provide holes to the channel layer 11b. The present disclosure does not limit a concentration of the P-type doping ions in the P-type semiconductor layer 13, as long as the conduction between the source electrode 14*b* and the drain electrode 14*c* can be realized through the channel layer 11*b*.

A formation processes of the P-type semiconductor layer 13 can be made reference to a formation process of the channel layer 11*b*. The doping ions in the P-type semiconductor layer 13 can be realized by an in-situ process.

Next, referring to step S2 in FIG. 1 and as shown in FIG. 3, the P-type semiconductor layer 13 in the gate region is removed by etching, and the P-type semiconductor layer 13 in the source region and the P-type semiconductor layer 13 in the drain region are remained.

The etching of the P-type semiconductor layer 13 can be implemented by dry etching. The dry etching can be inductively coupled plasma etching (ICP). The etching gas can include: $Cl_2$ and $BCl_3$.

Due to the arrangement of the etch stop layer 12, when removing the P-type semiconductor layer 13 in the gate region, etching can stop at the etch stop layer 12, so that an etching depth can be accurately controlled without causing etching damage to the channel layer 11*b*.

In the embodiment shown in FIG. 3, the P-type semiconductor layer 13 in the gate region is removed; in some embodiments, the P-type semiconductor layer 13 in the source region and the drain region can be retained, or the P-type semiconductor layer 13 in the source region and adjacent region thereof and the P-type semiconductor layer 13 in the drain region and adjacent region thereof can be retained, which is not limited in this embodiment.

After that, referring to step S3 in FIG. 1 and as shown in FIG. 3, the source electrode 14*b* is formed on the P-type semiconductor layer 13 in the source region, the drain electrode 14*c* is formed on the P-type semiconductor layer 13 in the drain region, and the multi-layer structure including the gate electrode insulating layer 15 and the gate electrode 14*a* is formed on the etch stop layer 12 in the gate region.

At step S3, an insulating layer, such as silicon dioxide, can be formed on the P-type semiconductor layer 13 and the etch stop layer 12 by physical vapor deposition or chemical vapor deposition, and then the insulating layer in regions other than the gate region is removed by etching to form the gate electrode insulating layer 15. After that, a metal layer, such as titanium (Ti)/aluminum (Al)/nickel (Ni)/aurum (Au), nickel (Ni)/aurum (Au), etc., is formed by sputtering; the metal layer in regions other than the gate region, the source region and the drain region are removed by etching, and ohmic contacts are formed between the source electrode 14*b* and the P-type semiconductor layer 13 and between the drain electrode 14C and the P-type semiconductor layer 13 by high-temperature annealing.

When the material of the P-type semiconductor layer 13 includes GaN, the source electrode 14*b* can directly form an ohmic contact layer with the P-type semiconductor layer 13, and the drain electrode 14*c* can directly form an ohmic contact layer with the P-type semiconductor layer 13 without high temperature annealing.

Referring to FIG. 3, the semiconductor structure 1 of the first embodiment includes:

the semiconductor substrate 10, the back barrier layer 11*a*, the channel layer 11*b* and the etch stop layer 12 arranged from bottom to up;

the P-type semiconductor layer 13 located in the source region and the drain region on the etch stop layer 12;

the source electrode 14*b* on the P-type semiconductor layer 13 in the source region, the drain electrode 14*c* on the P-type semiconductor layer 13 in the drain region, and the multi-layer structure, including the gate electrode insulating layer 15 and the gate electrode 14*a*, located on the etch stop layer 12 in the gate region.

A material of the semiconductor substrate 10 can include sapphire, silicon carbide, silicon, GaN or diamond.

The back barrier layer 11*a* and the channel layer 11*b* form a heterojunction, and two-dimensional hole gas can be formed at an interface between the back barrier layer 11*a* and the channel layer 11*b*.

Materials of the back barrier layer 11*a* and/or the channel layer 11*b* can include a group III nitride material. The group III nitride material can include at least one of GaN, AlGaN, InGaN, or AlInGaN. In an alternative solution, the material of the back barrier layer 11*a* includes AlGaN, and the channel layer 11*b* includes an unintentionally doped GaN layer. Generally, when growing the GaN-based epitaxial material by MOCVD, due to defects such as existence of nitrogen vacancies, oxygen doping and so on, the unintentionally doped intrinsic GaN has a high background electron concentration, presenting N-type conductive.

Under a same etching condition, the material of the etch stop layer 12 can be a material having a difference from the P-type semiconductor layer 13 in an etch rate, for example, the material of the etch stop layer 12 can be at least one of: AlN, AlGaN, an alternating multilayer superlattice structure with GaN/AlGaN, or an alternating multilayer superlattice structure with AlGaN/AlN. A thickness of the etch stop layer 12 ranges from 0.1 nm to 10 nm.

In some embodiments, the etch stop layer 12 can be a P-type doped material, such as at least one of: p-AlN, p-AlGaN, an alternating multilayer superlattice structure with p-GaN/p-AlGaN, or an alternating multilayer superlattice structure with p-AlGaN/p-AlN, to compensate holes for the channel layer 11*b*.

The material of the P-type semiconductor layer 13 can be a group III nitride material, such as at least one of GaN, AlGaN, or AlInGaN, and the P-type doping ions can include at least one of: magnesium (Mg) ions, zinc (Zn) ions, calcium (Ca) ions, strontium (Sr) ions or barium (Ba) ions, which can provide holes to the channel layer 11*b*.

Ohmic contacts are formed between the source electrode 14*b* and the P-type semiconductor layer 13 and between the drain electrode 14*c* and the P-type semiconductor layer 13. The materials of the source electrode 14*b*, the drain electrode 14*c*, and the gate electrode 14*a* can be metal, such as conductive materials of titanium (Ti)/aluminum (Al)/nickel (Ni)/aurum (Au), nickel (Ni)/aurum (Au), etc. The material of the gate electrode insulating layer 15 can include silicon dioxide.

Figure 4:
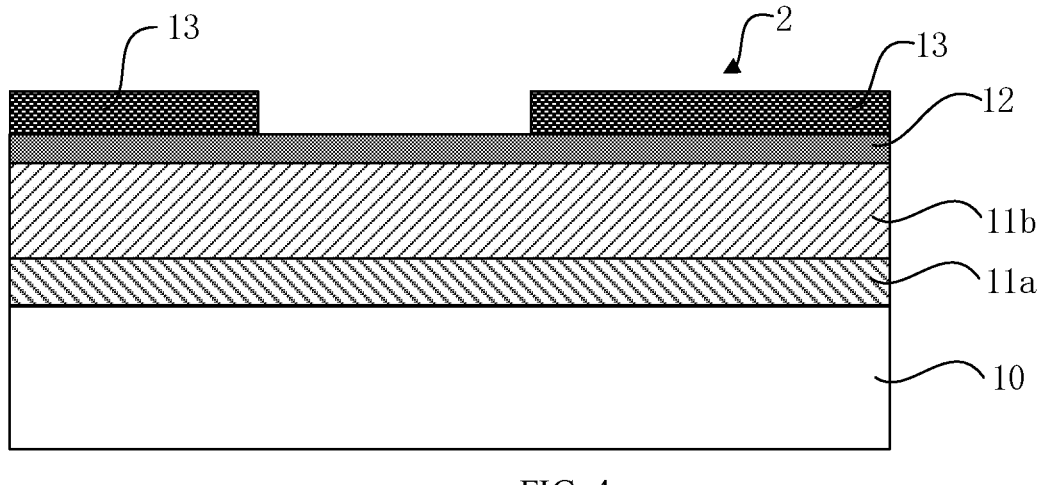
FIG. 4 is a cross-sectional structural diagram of a semiconductor structure according to a second embodiment of the present disclosure.

FIG. 4 is a cross-sectional structural diagram of a semiconductor structure according to a second embodiment of the present disclosure.

Referring to FIG. 4 and FIG. 3, the semiconductor structure 2 of the second embodiment is substantially the same as the semiconductor structure 1 of the first embodiment, except that the semiconductor structure 2 is an intermediate semiconductor structure, and the gate electrode insulating layer 15, the gate electrode 14*a*, the source electrode 14*b* and drain electrode 14*c* are not formed.

Correspondingly, the manufacturing method of the semiconductor structure 2 in the second embodiment is substantially the same as the manufacturing method of the semiconductor structure 1 in the first embodiment, and the difference is that step S3 is omitted.

The semiconductor structure 2 can also be produced and sold as a semi-finished product.

Figure 5:
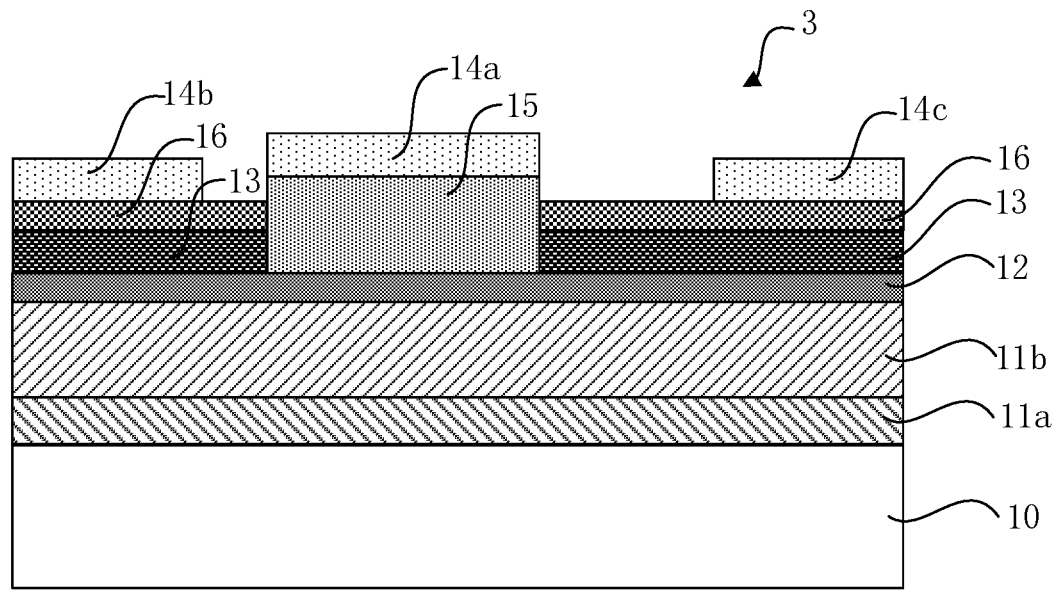
FIG. 5 is a cross-sectional structural diagram of a semiconductor structure according to a third embodiment of the present disclosure.

FIG. 5 is a cross-sectional structural diagram of a semiconductor structure according to a third embodiment of the present disclosure.

Referring to FIG. 5 and FIG. 3, the semiconductor structure 3 in the third embodiment is substantially the same as the semiconductor structure 1 in the first embodiment, except that the P-type semiconductor layer 13 in the source region and the P-type semiconductor layer 13 in the drain region have P-type ion heavily doped layer 16 on it.

The material of the P-type ion heavily doped layer 16 can be a group III nitride material, such as at least one of GaN, AlGaN, or AlInGaN, and the P-type doping ions can include at least one of: magnesium (Mg) ions, zinc (Zn) ions, calcium (Ca) ions, strontium (Sr) ions or barium (Ba) ions.

The P-type ion heavily doped layer 16 can provide more holes to participate in the conduction of the channel layer 11*b*.

In the P-type ion heavily doped layer 16, for different P-type ions, a doping concentration can be greater than $1E19/cm^3$.

The P-type ion heavily doped layer 16 can be formed by an epitaxial growth process. In the epitaxial growth process, the etch stop layer 12 can be configured as a mask layer to prevent the P-type ion heavily doped layer 16 from being formed on the etch stop layer 12. The P-type doping ions in the P-type ion heavily doped layer 16 can be realized by an in-situ doping process.

Figure 6:
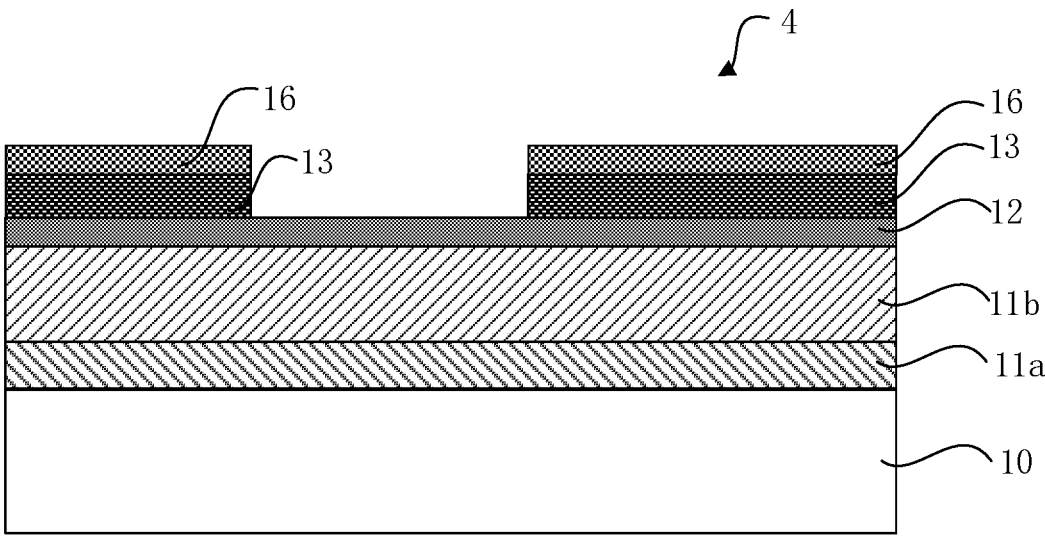
FIG. 6 is a cross-sectional structural diagram of a semiconductor structure according to a fourth embodiment of the present disclosure.

FIG. 6 is a cross-sectional structural diagram of a semiconductor structure according to a fourth embodiment of the present disclosure.

Referring to FIG. 6 and FIG. 5, the semiconductor structure 4 of the fourth embodiment is substantially the same as the semiconductor structure 3 of the third embodiment, except that the semiconductor structure 4 is an intermediate semiconductor structure, and the gate electrode insulating layer 15, the gate electrode 14*a*, the source electrode 14*b*, and the drain electrode 14*c* are not formed.

Correspondingly, the manufacturing method of the semiconductor structure 4 in the fourth embodiment is substantially the same as the manufacturing method of the semiconductor structure 3 in the third embodiment, except that step S3 is omitted.

The semiconductor structure 4 can also be produced and sold as a semi-finished product.

Figures 7, 8:
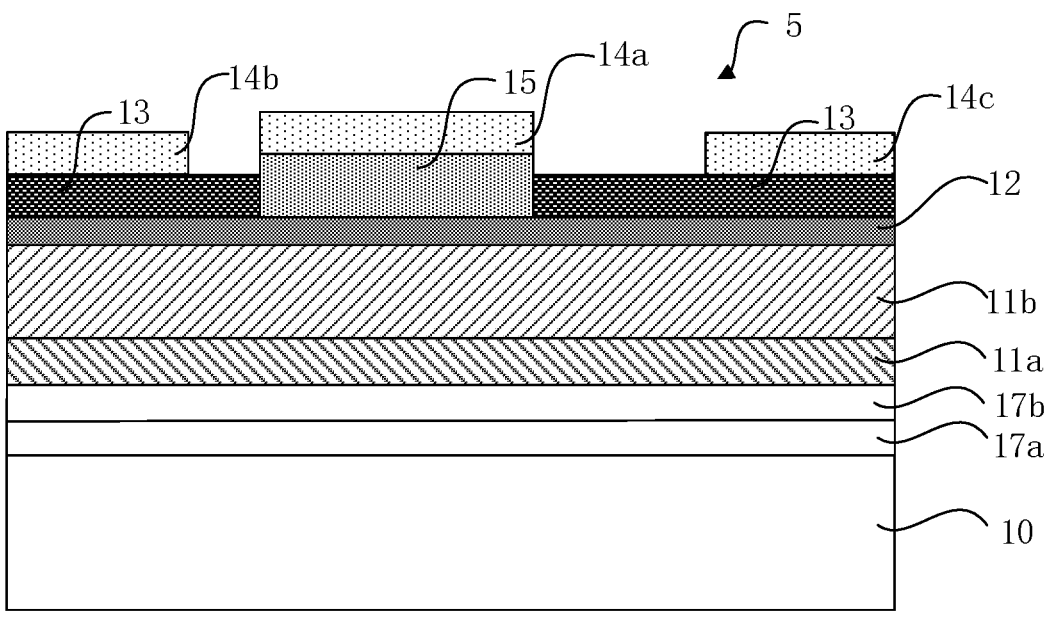
FIG. 7 is a cross-sectional structural diagram of a semiconductor structure according to a fifth embodiment of the present disclosure.
FIG. 8 is a cross-sectional structural diagram of a semiconductor structure according to a sixth embodiment of the present disclosure.

FIG. 7 is a cross-sectional structural diagram of a semiconductor structure according to a fifth embodiment of the present disclosure.

Referring to FIG. 7, FIG. 3 and FIG. 5, the semiconductor structure 5 of the fifth embodiment and the manufacturing method thereof are substantially the same as the semiconductor structure 1 and the semiconductor structure 3 and the manufacturing methods thereof in the first and third embodiments, except that a nucleation layer 17*a* and a buffer layer 17*b* are provided from bottom to up between the semiconductor substrate 10 and the back barrier layer 11*a*.

A material of the nucleation layer 17*a* can include, for example, AN, AlGaN, or etc., and a material of the buffer layer 17*b* can include at least one of AlN, GaN, AlGaN, or AlInGaN. The nucleation layer 17*a* can alleviate a problem of lattice mismatch and thermal mismatch of epitaxially grown semiconductor layer, such as between the back barrier layer 11*a* and the semiconductor substrate 10, and the buffer layer 17*b* can reduce a dislocation density and a defect density of the epitaxially grown semiconductor layer to improve crystal quality.

FIG. 8 is a cross-sectional structural diagram of a semiconductor structure according to a sixth embodiment of the present disclosure.

Referring to FIG. 8 and FIG. 7, the semiconductor structure 6 of the sixth embodiment is substantially the same as the semiconductor structure 5 of the fifth embodiment, except that the semiconductor structure 6 is an intermediate semiconductor structure, and the gate electrode insulating layer 15, the gate electrode 14*a*, the source electrode 14*b* and the drain electrode 14*c* are not formed.

Correspondingly, the manufacturing method of the semiconductor structure 6 in the sixth embodiment is substantially the same as the manufacturing method of the semiconductor structure 5 in the fifth embodiment, except that step S3 is omitted.

The semiconductor structure 6 can also be produced and sold as a semi-finished product.

Figure 9:
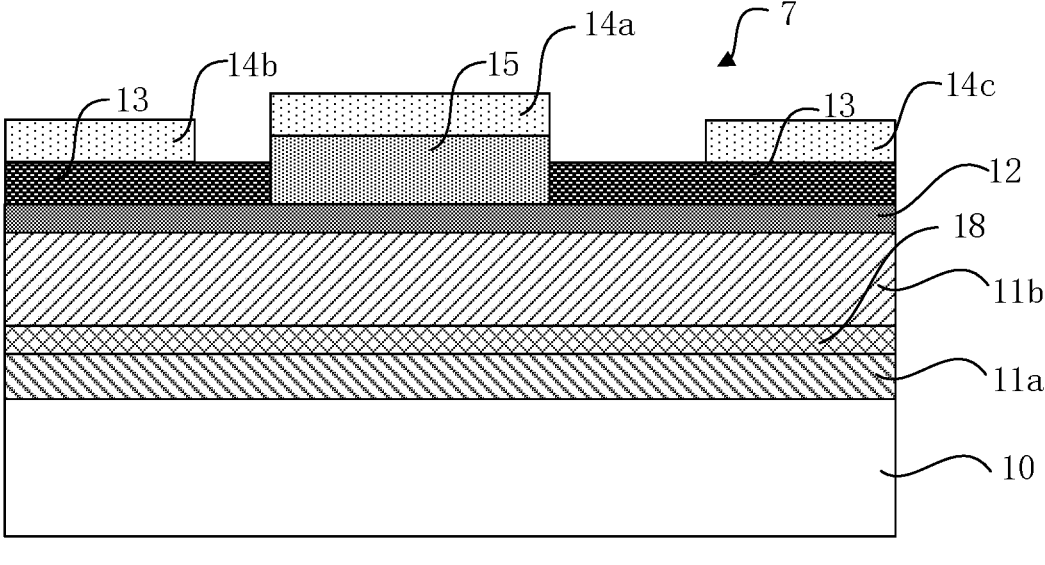
FIG. 9 is a cross-sectional structural diagram of a semiconductor structure according to a seventh embodiment of the present disclosure.

FIG. 9 is a cross-sectional structural diagram of a semiconductor structure according to a seventh embodiment of the present disclosure.

Referring to FIG. 9, FIG. 3, FIG. 5 and FIG. 7, the semiconductor structure 7 of the seventh embodiment and the manufacturing method thereof are substantially the same as the semiconductor structure 1, the semiconductor structure 3 and the semiconductor structure 5 and the manufacturing methods thereof in the first, third and fifth embodiments, except that there is an anti-alloy scattering layer 18 between the back barrier layer 11*a* and the channel layer 11*b*.

The material of the anti-alloy scattering layer 18 can include AlN. The anti-alloy scattering layer 18 can avoid alloy scattering and further improve mobility of carriers of holes. A thickness of the anti-alloy scattering layer 18 ranges from 0.1 nm to 10 nm.

Figure 10:
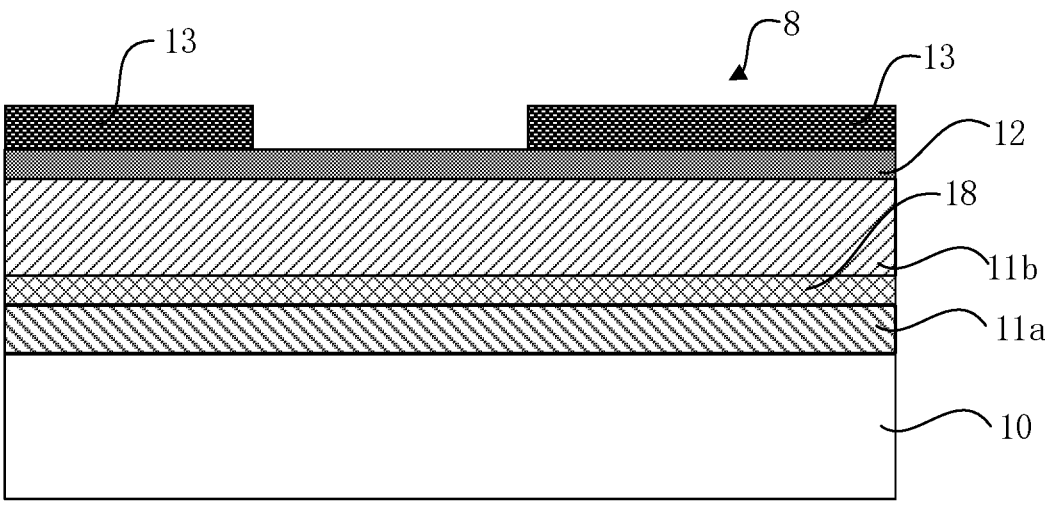
FIG. 10 is a cross-sectional structural diagram of a semiconductor structure according to an eighth embodiment of the present disclosure.

FIG. 10 is a cross-sectional structural diagram of a semiconductor structure according to an eighth embodiment of the present disclosure.

Referring to FIG. 10 and FIG. 9, the semiconductor structure 8 of the eighth embodiment is substantially the same as the semiconductor structure 7 of the seventh embodiment, except that the semiconductor structure 8 is an intermediate semiconductor structure, and the gate electrode insulating layer 15, the gate electrode 14*a*, the source electrode 14*b* and the drain electrode 14*c* are not formed.

Correspondingly, the manufacturing method of the semiconductor structure 8 in the eighth embodiment is substantially the same as the manufacturing method of the semiconductor structure 7 in the seventh embodiment, except that step S3 is omitted.

The semiconductor structure 8 can also be produced and sold as a semi-finished product.

Although the present disclosure is disclosed above, the present disclosure is not limited thereto. Any ordinary skilled in the art can make various variants and modifications to the present disclosure without departing from the spirit and scope of the present disclosure. Therefore, the protection scope of the present disclosure should be set forth by the appended claims.

The invention claimed is:

1. A semiconductor structure, comprising:
   a semiconductor substrate, a back barrier layer, a channel layer and an etch stop layer sequentially arranged from a bottom of the semiconductor structure to a top of the semiconductor structure, wherein a two-dimensional hole gas is formed at an interface between the back barrier layer and the channel layer, the etch stop layer is vertically above the two-dimensional hole gas; and a P-type semiconductor layer located in a source region and a drain region on the etch stop layer, wherein a P-type ion heavily doped layer is provided on the P-type semiconductor layer in the source region and the P-type semiconductor layer in the drain region.

2. The semiconductor structure of claim 1, wherein a material of the P-type semiconductor layer comprises a group III nitride material.

3. The semiconductor structure of claim 1, wherein a material of the etch stop layer comprises at least one of: AlN, AlGaN, an alternating multilayer superlattice structure with GaN/AlGaN, or an alternating multilayer superlattice with AlGaN/AlN.

4. The semiconductor structure of claim 1, wherein the etch stop layer includes a P-type doped material.

5. The semiconductor structure of claim 1, wherein the channel layer-comprises a group III nitride material.

6. The semiconductor structure of claim 1, wherein a source electrode is provided on the P-type semiconductor layer in the source region, and a drain electrode is provided on the P-type semiconductor layer in the drain region, a multi-layer structure, comprising a gate electrode insulating layer and a gate electrode, is provided on the etch stop layer in a gate region.

7. The semiconductor structure of claim 1, wherein a material of the etch stop layer is a material having a difference from the P-type semiconductor layer in an etch rate.

8. The semiconductor structure of claim 1, wherein a thickness of the etch stop layer ranges from 0.1 nm to 10 nm.

9. The semiconductor structure of claim 1, wherein a nucleation layer and a buffer layer are provided from bottom to top between the semiconductor substrate and the back barrier layer.

10. The semiconductor structure of claim 4, wherein the material of the etch stop layer comprises at least one of p-AlN, p-AlGaN, an alternating multilayer superlattice structure with p-GaN/p-AlGaN, or an alternating multilayer superlattice structure with p-AlGaN/p-AlN.

11. A method of manufacturing a semiconductor substrate, comprising:

providing a semiconductor substrate;

forming a back barrier layer, a channel layer, an etch stop layer and a P-type semiconductor layer sequentially on the semiconductor substrate, wherein a two-dimensional hole gas is formed at an interface between the back barrier layer and the channel layer, the etch stop layer is vertically above the two-dimensional hole gas;

removing the P-type semiconductor layer in a gate region by etching, retaining the P-type semiconductor layer in a source region and the P-type semiconductor layer in a drain region; and forming a P-type ion heavily doped layer respectively on the P-type semiconductor layer in the source region and the P-type semiconductor layer in the drain region.

12. The method of claim 11, wherein a material of the P-type semiconductor layer comprises a group III nitride material.

13. The method of claim 11, wherein a material of the etch stop layer-comprises at least one of: AlN, AlGaN, an alternating multilayer superlattice structure with GaN/AlGaN, or an alternating multilayer superlattice with AlGaN/AlN.

14. The method of claim 11, wherein a material of the etch stop layer-comprises at least one of p-AlN, p-AlGaN, an alternating multilayer superlattice structure with p-GaN/p-AlGaN, or an alternating multilayer superlattice structure with p-AlGaN/p-AlN.

15. The method of claim 11, wherein the channel layer comprises a group III nitride material.

16. The method of claim 11, further comprising: forming a source electrode on the P-type semiconductor layer in the source region;

forming a drain electrode on the P-type semiconductor layer in the drain region; and forming a multi-layer structure, comprising a gate electrode insulating layer and a gate electrode, on the etch stop layer in the gate region.

\* \* \* \* \*